(12) United States Patent
Kryzak et al.

(10) Patent No.: US 6,700,510 B1
(45) Date of Patent: *Mar. 2, 2004

(54) SCALABLE PHYSICAL CODING SUBLAYER (PCS) AND 8B/10B ENCODER

(75) Inventors: Joseph Neil Kryzak, Ames, IA (US); Thomas E. Rock, Richmond, IL (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/294,212

(22) Filed: Nov. 13, 2002

Related U.S. Application Data

(63) Continuation of application No. 09/823,842, filed on Mar. 30, 2001, now Pat. No. 6,501,396.

(51) Int. Cl.[7] .................................. H03M 7/00
(52) U.S. Cl. .......................... 341/59; 341/58; 341/61; 341/102; 341/103
(58) Field of Search .................... 341/50–106

(56) References Cited

U.S. PATENT DOCUMENTS

| | | | | |
|---|---|---|---|---|
| 4,486,739 A | * | 12/1984 | Franaszek et al. | ............ 341/59 |
| 4,995,056 A | | 2/1991 | Fogg, Jr. et al. | |
| 5,136,410 A | | 8/1992 | Heiling et al. | |
| 5,151,977 A | | 9/1992 | Fredericks et al. | |
| 5,177,482 A | * | 1/1993 | Cideciyan et al. | ............ 341/59 |
| 5,260,933 A | | 11/1993 | Rouse | |
| 5,304,996 A | * | 4/1994 | Hsu et al. | ............ 341/95 |
| 5,396,239 A | * | 3/1995 | McMahon et al. | ............ 341/58 |
| 5,663,724 A | * | 9/1997 | Westby | ............ 341/59 |
| 6,054,944 A | | 4/2000 | Yamashita | |
| 6,111,528 A | | 8/2000 | Bagley | |
| 6,295,010 B1 | | 9/2001 | Thiesfeld | |
| 6,425,107 B1 | * | 7/2002 | Caldara et al. | ............ 714/759 |

* cited by examiner

*Primary Examiner*—Michael Tokar
*Assistant Examiner*—Linh Van Nguyen
(74) *Attorney, Agent, or Firm*—H. C. Chan; Edel M. Young; Justin Liu

(57) ABSTRACT

A scalable physical coding sublayer (PCS) can be adjusted to provide different combinations of communication channels and data widths. The PCS can use 8B/10B encoders having a disparity input connection and at least one disparity output connection. In one embodiment, the encoder has both a synchronous and an asynchronous disparity output connection. The encoder can be coupled with additional encoders to provide an expanded width channel of 16B/20B encoding. Additional configurations are possible. In expanded operation, only one of the encoders needs to output special codes. The encoders, therefore, include a slave input connection to place the encoder in a slave mode so that a special code is replaced with an inert special code. All but one encoder in an expanded system are slave encoders. An idle input connection is also provided in the encoders to place the encoder in an idle mode where pre-defined data is output from the encoder.

11 Claims, 8 Drawing Sheets

5B/6B Encoding Tables

FIG. 5

3B/4B Encoding Tables

| Name | F | G | H | K | BIT ENC | DISPARITY | D-1 | f | g | h | j | D0 f | g | h | j |
|---|---|---|---|---|---|---|---|---|---|---|---|---|---|---|---|
| D/K.x.0 | 0 | 0 | 0 | X | F?G?H' | F?G' | + | 0 | 1 | 0 | 0 | 1 | 0 | 1 | 1 |
| D.x.1 | 1 | 0 | 0 | 0 | (F!=G)?H' |  | X | 1 | 0 | 0 | 1 |  |  |  |  |
| D.x.2 | 0 | 1 | 0 | 0 | (F!=G)?H' |  | X | 0 | 1 | 0 | 1 |  |  |  |  |
| D/K.x.3 | 1 | 1 | 0 | X |  | F?G | – | 1 | 1 | 0 | 0 | 0 | 0 | 1 | 1 |
| D/K.x.4 | 0 | 0 | 1 | X |  | F?G' | + | 0 | 0 | 1 | 0 | 1 | 1 | 0 | 1 |
| D.x.5 | 1 | 0 | 1 | 0 |  |  |  | 1 | 0 | 1 | 0 |  |  |  |  |
| D.x.6 | 0 | 1 | 1 | 0 |  |  |  | 0 | 1 | 1 | 0 |  |  |  |  |
| D.xP7 | 1 | 1 | 1 | 0 |  | F?G, F?G?H | – | 1 | 1 | 1 | 0 | 0 | 0 | 0 | 1 |
| D/K.y.A7 | 1 | 1 | 1 | X | F?G?H?(S+K) S={e?!(D-1=–)} +{e?!(D-1=+)} | F?G, F?G?H | – | 0 | 1 | 1 | 1 | 1 | 0 | 0 | 0 |
| K28.1 | 1 | 0 | 0 | 1 | (F!=G) ?H' | (F!=G) ?K | + | 1 | 0 | 0 | 1 | 0 | 1 | 1 | 0 |
| K28.2 | 0 | 1 | 0 | 1 | (F!=G) ?H' | (F!=G) ?K | + | 0 | 1 | 0 | 1 | 1 | 0 | 1 | 0 |
| K28.5 | 1 | 0 | 1 | 1 |  | (F!=G) ?K | + | 1 | 0 | 1 | 0 | 0 | 1 | 0 | 1 |
| K28.6 | 0 | 1 | 1 | 1 |  | (F!=G) ?K | + | 0 | 1 | 1 | 0 | 1 | 0 | 0 | 1 |

K.x Restricted to K.28
K.y Restricted to K.23, K.27, K.28, K.29, K.30

Special Characters (K=1)

| Name | A | B | C | D | E | F | G | H | K | D-1 a b c d e i f g h i j D0 | D0 D-1 a b c d e i f g h i j D0 |
|---|---|---|---|---|---|---|---|---|---|---|---|
| ????? | 0 | 0 | 0 | 0 | 0 | 0 | 0 | 0 | 1 | - 0 0 1 1 1 1 1 0 0 0 0 0 | + 1 1 0 0 0 0 0 1 1 1 1 0 |
| K.28.1* | 0 | 0 | 0 | 0 | 1 | 1 | 0 | 0 | 1 | - 0 0 1 1 1 1 0 1 0 0 0 - | + 1 1 0 0 0 0 1 0 1 1 1 - |
| K.28.2 | 0 | 0 | 0 | 0 | 0 | 1 | 0 | 0 | 1 | - 0 0 1 1 1 1 0 0 1 0 0 - | + 1 1 0 0 0 0 1 1 0 1 1 - |
| K.28.3 | 0 | 0 | 0 | 0 | 1 | 1 | 0 | 0 | 1 | - 0 0 1 1 1 1 0 0 1 1 0 0 | + 1 1 0 0 0 0 1 1 0 0 1 + |
| K.28.4 | 0 | 0 | 0 | 0 | 0 | 0 | 1 | 0 | 1 | - 0 0 1 1 1 1 0 0 0 1 0 - | + 1 1 0 0 0 0 1 1 1 0 1 - |
| K.28.5* | 0 | 0 | 0 | 0 | 1 | 0 | 1 | 0 | 1 | - 0 0 1 1 1 1 1 0 1 0 1 0 | + 1 1 0 0 0 0 0 1 0 1 0 + |
| K.28.6 | 0 | 0 | 0 | 0 | 0 | 1 | 1 | 0 | 1 | - 0 0 1 1 1 1 1 0 0 1 1 - | + 1 1 0 0 0 0 0 1 1 0 0 - |
| K.28.7 | 0 | 0 | 0 | 0 | 1 | 1 | 1 | 0 | 1 | - 0 0 1 1 1 1 1 0 0 0 1 0 | K.28.7 Must not be contiguous to another K.28.7 |
| K.23.7 | 1 | 1 | 1 | 0 | 1 | 0 | 1 | 1 | 1 | - 1 1 1 0 1 0 1 0 0 0 1 0 | + 0 0 0 1 0 1 0 1 1 1 0 + |
| K.27.7 | 1 | 1 | 0 | 1 | 1 | 0 | 1 | 1 | 1 | - 1 1 0 1 1 0 1 0 0 0 1 0 | + 0 0 1 0 0 1 0 1 1 1 0 + |
| K.29.7 | 1 | 0 | 1 | 1 | 1 | 0 | 1 | 1 | 1 | - 1 0 1 1 1 0 1 0 0 0 1 0 | + 0 1 0 0 0 1 0 1 1 1 0 + |
| K.30.7 | 0 | 1 | 1 | 1 | 1 | 0 | 1 | 1 | 1 | - 0 1 1 1 1 0 1 0 0 0 1 0 | + 1 0 0 0 0 1 0 1 1 1 0 + |

* Singular Comma (For byte synchronization)

FIG. 9

5B/6B Encoding Tables / Special Codes

| Name | A | B | C | D | E | K | BIT ENC | DISPARITY | SLAVE | IDLE DATA | D- a b c d e i | D0 | ALTERNATE a b c d e i |
|---|---|---|---|---|---|---|---|---|---|---|---|---|---|
| K.28 | 0 | 0 | 1 | 1 | 1 | 1 | L22?K | K | 0 0 - | 1 | 0 0 1 1 1 1 | + | 1 1 0 0 0 0 |
| K.28 | 0 | 0 | 1 | 1 | 1 | 1 | L22?K | K | 0 1 - | 0 | * * * * * * | * | * * * * * * |
| X | X | X | X | X | X | X |  |  | X 1 - | X | 1 0 1 0 0 1 | + | 1 0 0 1 0 0 |

FIG. 10

3B/4B Encoding Tables

| Name | F | G | H | K | BIT ENC | DISPARITY | SLAVE | IDLE DATA | D-1 f g h j | D0 | ALTERNATE f g h j |
|---|---|---|---|---|---|---|---|---|---|---|---|
| K28.5 | 1 | 0 | 1 | 1 | (F!=G) ?K | K | 0 - | 0 | + 0 1 0 1 | 0 | 1 0 1 1 |
| K28.5 | 1 | 0 | 1 | 1 | (F!=G) ?K | K | 1 - | 0 | + * * * * | * | * * * * |
| X | X | X | X | X |  |  | X - | 1 | - 0 1 1 0 | + | 1 0 0 0 |

SCALABLE PHYSICAL CODING SUBLAYER (PCS) AND 8B/10B ENCODER

TECHNICAL FIELD OF THE INVENTION

The present invention relates generally to physical coding sublayer (PCS) systems and in particular the present invention relates to a scalable PCS system.

BACKGROUND OF THE INVENTION

Encoding and decoding systems are often used in data communication. For example, fiber optic systems often use a byte oriented DC balanced run length limited 8B/10B encoder/decoder. One example of an 8B/10B encoder is provided in U.S. Pat. No. 4,486,739 issued Dec. 4, 1984 for "Byte Oriented DC Balanced 8B/10B Partitioned Block Transmission Code" by Franaszek et al., incorporated herein by reference. The Franaszek 8B/10B encoder/decoder partitions an 8-bit input word into a 5-bit portion and a 3-bit portion. The 5-bit portion is encoded into a 6-bit output, and the 3-bit portion is encoded into a 4-bit output. A detailed description of an 8B/10B encoding technique is described in Franaszek.

Run length is defined as a number of identical contiguous symbols (ones or zeros) that appear in a data stream. A large number of contiguous binary ones will produce a highly positive DC signal, whereas a large number of contiguous binary zeros will produce a highly negative DC signal. It is important, however, to maintain a DC balanced in the signal, both in long data strings as well as short data strings.

A disparity of a block of data is the difference between a number of data one bits and a number of data zero bits in a block of data. The Franaszek patent adjusts a DC level on output data by comparing the running disparity from prior words to the disparity of a current word being encoded. The output data word, or a complement thereof, is then output based upon the comparison. For example, if the running disparity is +1 and the current output word has a disparity of +2, the current output data is complemented to a word with a disparity of −2 and a −1 disparity is internally passed to the next encoding stage. That is, the running disparity from a 5B/6B encoder stage is passed to a 3B/4B encoder stage, and the running disparity from the 3B/4B encoder stage is held to encode the 5-bit input portion of the next word in the 5B/6B encoder. The running disparity for the 5B/6B encoder is latched on the negative edge of the clock, and coupled to the 3B/4B encoder. Similarly, the output of the running disparity from the 3B/4B encoder is latched on the positive edge of the clock and coupled to the 5B/6B block.

Bandwidth requirements of transmitted data are increasing with the increase in communication speeds. For example, the above-described encoder can handle a single 1.25 Gbit data channel. However, a 6.25 Gbit channel may be desired. Present 8B/10B encoders are not scalable to provide these increased bandwidth requirements.

A 16B/20B encoder is described in U.S. Pat. No. 5,663,724 entitled "16B/20B Encoder" to Westby, issued Sep. 2, 1997, incorporated herein by reference. The described encoder includes upper 5B/6B and 3B/4B encoder blocks and lower 5B/6B and 3B/4B encoder blocks. The single device couples a disparity from the upper 5B/6B block to the upper 3B/4B encoder block. A disparity from the upper 3B/4B encoder block is coupled to the lower 5B/6B encoder block. Likewise, a disparity from the lower 5B/6B block is coupled to the lower 3B/4B encoder block, and disparity from the lower 3B/4B encoder block is coupled to the upper 5B/6B encoder block. The described 16B/20B encoder is not scalable and a disparity of the upper 10 bits may not be accurately reflected in the lower 10 bits.

For the reasons stated above, and for other reasons stated below which will become apparent to those skilled in the art upon reading and understanding the present specification, there is a need in the art for a scalable physical coding sublayer. There is a further need for a scalable 8B/10B encoder/decoder.

SUMMARY OF THE INVENTION

The above-mentioned problems with encoders/decoders and other problems are addressed by the present invention and will be understood by reading and studying the following specification. The present invention provides a scalable 8B/10B encoder/decoder.

In one embodiment, a scalable physical coding sublayer (PCS) system comprises N encoders to receive input data, each of the N encoders provides encoded X-bit output data, and a controller to operate the N encoders to provide from 1 to N channels, along with combinations of integer multiples, Y, of the single channel, whose sum does not exceed N, each channel providing Y*X output bits, with the combined channel structure outputting X*N bits.

In another embodiment, a scalable physical coding sublayer (PCS) system comprises N encoders to receive input data and provide encoded output data. Each of the N encoders have synchronous and asynchronous data disparity outputs and defines a single communication channel. Disparity select circuitry is coupled to the N encoders, and a controller is provided to operate the disparity select circuitry to provide an N-wide communication channel.

In yet another embodiment, a physical coding sublayer (PCS) system comprises a state machine, an eight-bit input to receive eight bits of input data, and an eight-bit to ten-bit encoder coupled to the state machine and the eight-bit input. The eight-bit to ten-bit encoder comprises encoder circuitry to encode the eight bits of input data into ten bits of output data, disparity control circuitry to calculate a running disparity of the ten bits of output data, an output disparity connection to provide the running disparity of the ten bits of output data, and an input disparity connection to receive an externally provided running disparity.

An 8B/10B encoder comprises eight input data connections to receive eight input data signals, a control input connection to receive a control signal, a disparity input connection to receive a disparity input signal, and ten output data connections to provide ten encoded output data signals. A disparity output connection is provided to indicate a running disparity based on the ten encoded output data signals and the disparity input signal.

BRIEF DESCRIPTION OF THE DRAWINGS

Figure 5:
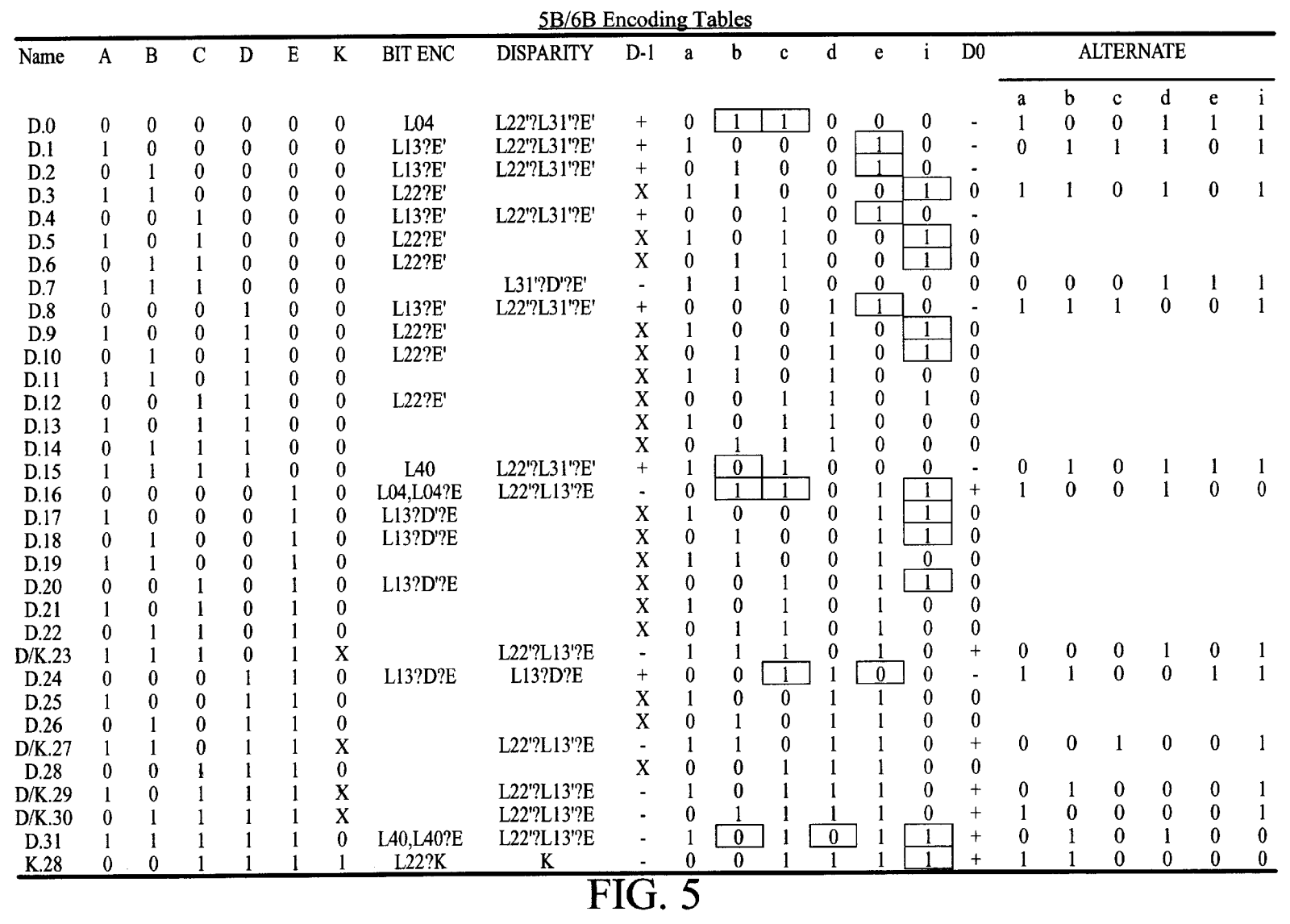

FIG. 5 is a prior art mapping table of one possible 5b/6b encoding formula;

FIG. 6 is a prior art mapping table of one possible 3b/4b encoding formula;

FIG. 8 is a table of special codes that can be used in a physical coding sublayer embodiment;

FIG. 9 is a table that illustrates some differences between an embodiment of the present invention and the prior art 5B/6B encoding formula of FIG. 5; and FIG. 10 is a table that illustrates some differences between an embodiment of the present invention and the prior art 3B/4B encoding formula of FIG. 6.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention, in one embodiment, provides a scalable encoder/decoder. The encoder can be used in a variety of communication systems. One application is a PCS (physical coding sublayer) system. Prior to describing a PCS embodiment of the present invention, the encoder is described in greater detail. Many of the features of the encoder operation are described with reference to the PCS application. The PCS application, in general, encodes input data to provide output data. Specific coding formulas are used by the encoder and depend upon the system operation. The PCS application encodes data to maintain a DC balanced output. As such, output disparity of previous data is used to encode the data. The encoder, in a PCS system, outputs special codes to synchronize and operate the system. The present scalable encoder addresses the need to prohibit multiple transmissions of these special codes when multiple encoders operate together. Those skilled in the art will appreciate that encoding formula are often dictated by governing bodies, such as IEEE, and a particular formula does not form a part of the current invention.

Figure 1:
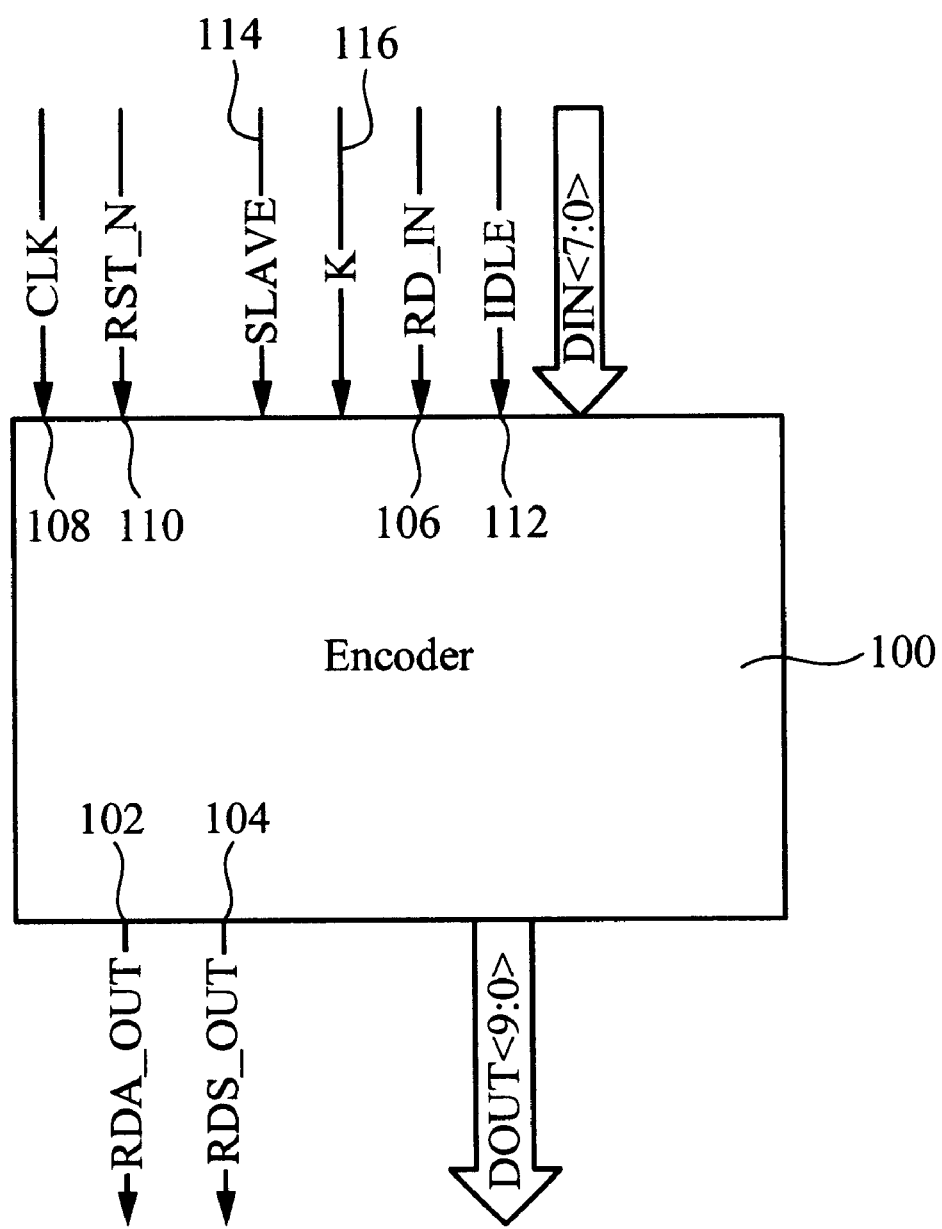
FIG. 1 is a block diagram of an encoder circuit of one embodiment of the present invention.

One embodiment of the present invention is an 8-bit to 10-bit (8B/10B) encoder illustrated in FIG. 1. The encoder 100 has a disparity output connection to allow multiple encoders to be coupled together to increase bandwidth of a system. The running disparity indicates a running DC disparity of a current 10-bits of output data based on the disparity of a previous 10-bits of output data. Two or more 8B/10B encoders can be coupled to provide different communication channel configurations. The following section of the detailed description describes an embodiment of the encoder and an application of the scalable encoder for use in a physical coding sub-layer.

The present scalable 8B/10B encoder 100 has two outputs, one for a synchronous running disparity 104, and one for an asynchronous running disparity 102. Each encoder also has a running disparity input 106 to receive a running disparity output signal from a scalable encoder, explained below. A synchronizing clock signal input 108 and a reset signal input 110 are also provided. An idle signal input 112 is used to request that idle data be sent from the encoder. A slave signal input 114, when enabled, detects a specific input data pattern, and sends a pre-selected output data pattern, also explained below. A control signal (K) input 116 for the 8B/10B operation is also included.

Figure 2:
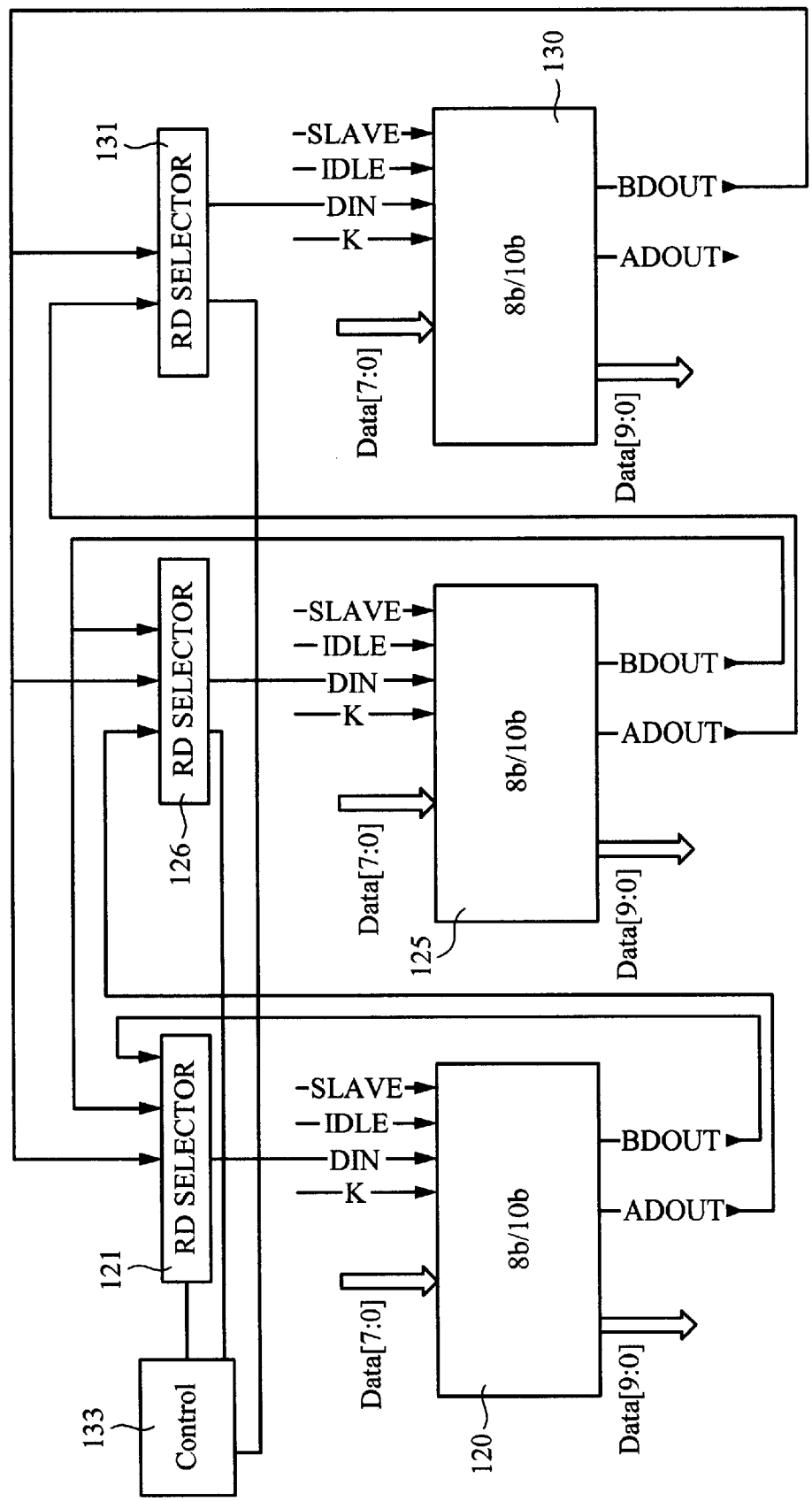
FIG. 2 illustrates three encoders of FIG. 1 coupled together.

The scalable encoder uses the running disparity connections to cascade encoders and provide communication channels that are wider than traditional 8-bit channels. FIG. 2 illustrates an embodiment where three scalable encoders 120, 125 and 130 are coupled together. The running disparity output from each encoder is selectively coupled to the disparity input of the other decoder(s).

Referring to FIG. 2, the three encoders are coupled to operate as an 8B/10B, a 16B/20B or a 24B/30B system. Disparity select circuitry 121, 126 and 131 is provided to route the disparity output signals to appropriate encoders in response to the encoder mode that is selected. A control circuit 133 is provided to control the disparity select circuitry. The control circuitry can include programmable registers to modify the select circuitry during operation to change a configuration of the system. When the encoders operate in an expanded mode (16B/20B or 24B/30B), the asynchronous disparity output is coupled from a first encoder to the subsequent encoder. The asynchronous disparity output, therefore, allows all of the encoders of the expanded system to calculate a disparity of the encoded data on a common clock cycle. The synchronous disparity output is used to provide a current disparity to the encoder for use as a basis for determining the disparity of the next clock cycle.

To better understand the expanded system, operation of the disparity select circuitry is described. If encoder 120 is desired to operate as a single 8B/10B encoder, select circuit 121 routes the synchronous disparity output from encoder 120 to the disparity input of encoder 120. That is, encoder 120 synchronously provides the disparity input for itself. In operation, the synchronous disparity output provides the input for the next clock cycle disparity calculation. It will be appreciated that encoders 125 and 130 can be coupled in the same manner. The three encoders, therefore, can be operated as three 8B/10B encoder channels.

Encoders 121 and 125 can be coupled to operate as a 16B/20B encoder channel. These encoders need to simultaneously (same clock cycle) calculate a disparity for the 20-bit output. If the encoders were coupled in a synchronous manner, encoder 120 would generate a disparity for the first 10-bits on a first clock cycle and encoder 125 would generate a disparity for the second 10-bits on a second clock cycle. As such, the present invention provides an asynchronous disparity output. In operation, the asynchronous disparity from encoder 120 is coupled through disparity select circuit 126 to the disparity input of encoder 125. The disparity for the first 10-bits of encoder 120 is coupled to encoder 125 to generate a disparity for the second 10-bits during a common clock cycle. The synchronous disparity output from encoder 125 is then coupled to the disparity input of encoder 120. On a subsequent clock cycle, the disparity for the entire 20-bit output is used by encoder 120 to determine a new disparity. It will be appreciated that encoder 130 can be operated as an 8B/10B encoder channel in this expanded system.

The three encoders can be coupled together to provide a single 24B/30B encoder channel. In this configuration, the asynchronous output of encoder 120 is coupled to the disparity input of encoder 125. Likewise, the asynchronous output of encoder 125 is coupled to the disparity input of encoder 130. The synchronous disparity output of encoder 130 is coupled to the disparity input of encoder 120. The three encoders, therefore, calculate a disparity for the 30-bits on each clock cycle.

Data provided as input to the encoders can be input special codes used to request a response from the encoders. Special input codes are identified when the control input is active (K=1). Further, the slave input signal for each subsequent encoder 125 and 130 in the expanded system is used to substitute an inert special code signal in response to the special code, such as a synchronizing code. That is, each of the multiple encoders should not transmit a special code when the encoders are coupled to operate as an expanded channel. The first encoder is used to provide the synchronizing output and the remaining encoders provide inert special codes. In an alternate embodiment, the single slave signal input for each encoder is replaced with two input connections to receive a two-bit slave signal input. This two-bit signal allows the encoder to select from multiple possible inert codes to transmit during slave mode.

Scalable PCS System

The encoder described above can extend the function of a physical coding sublayer (PCS) as described in IEEE standard 802.3 (incorporated herein by reference) to multiple channels, while still keeping the original functionality of the PCS intact. The present 8B/10B encoder system is referred to herein as a "NPCS" where N indicates a number of channels in the corresponding physical medium attachment (PMA) that can contain a 1.25 Gbit channel. The resulting NPCS has the ability to send N independent IEEE 802.3 channels, one single N wide ("extended") channel, or combinations that result in the channel width. Using N=5 (5 decoders in the system) as an example, there are five possible combinations: five independent 1.25 Gbit channels; one 1.25 Gbit, and a 4*1.25 Gbit channel; one 1.25 Gbit channel, a 2*1.25 Gbit channel, and a 2*1.25 Gbit channel; a 3*1.25 Gbit channel, and a 2*1.25 Gbit channel; and a 5*1.25 Gbit channel. All of these combinations can be controlled while the encoder is operating. That is, control registers in a management section of the system can select a desired combination, as explained above.

Figure 3:
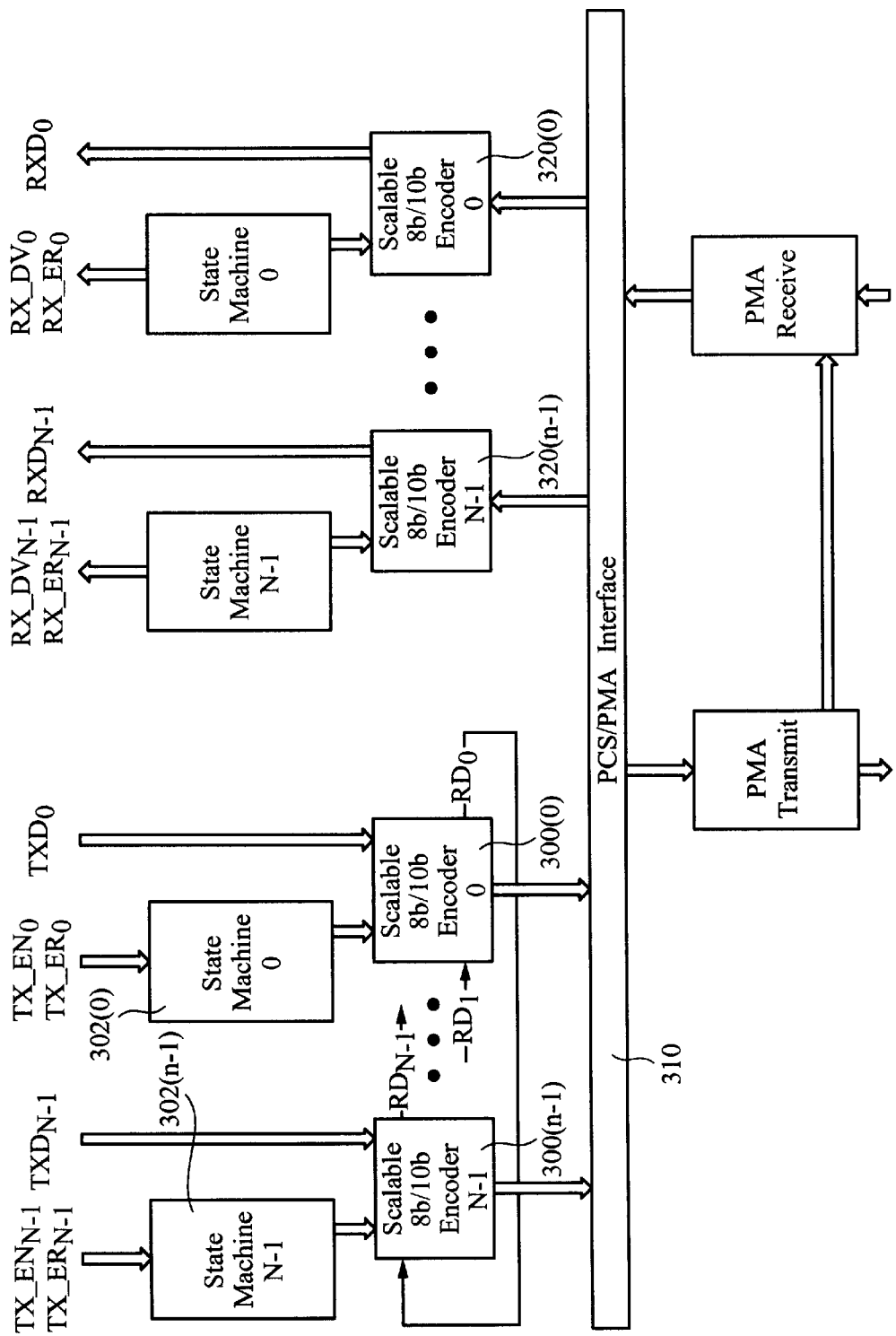
FIG. 3 illustrates a NPCS system incorporating the present invention.

FIG. 3 illustrates a simplified NPCS system incorporating the present invention. The system includes multiple 8B/10B encoders 300(0–300(n–1). The encoders are coupled as described above to operate in an extended mode. Each encoder has a state machine 302(0)–302(n–1) for controlling encoder operations. The encoders are coupled to the PCS/PMA interface 310. Likewise, multiple encoders 320(0)–320(n–1) are used on the receiving side to decode data from the PCS/PMA interface. Data flow through the NPCS transmits the least significant bit first. That is, channel 0 is transmitted first, followed by channel 1, continued to channel n–1. The first channel is considered the master, and encodes all data according to IEEE 802.3 rules. The slave encoders (channels 1 to n–1) substitute K28.5 comma patterns (synchronizing pattern) with K28.x patterns (inert pattern), where a user determines x.

Received data flow through the NPCS receives the least significant bit first. Channel 0 is received first, followed by channel 1 to channel n–1. The first channel is considered a master, and decodes all data according to the IEEE 802.3z rules.

Figure 4:
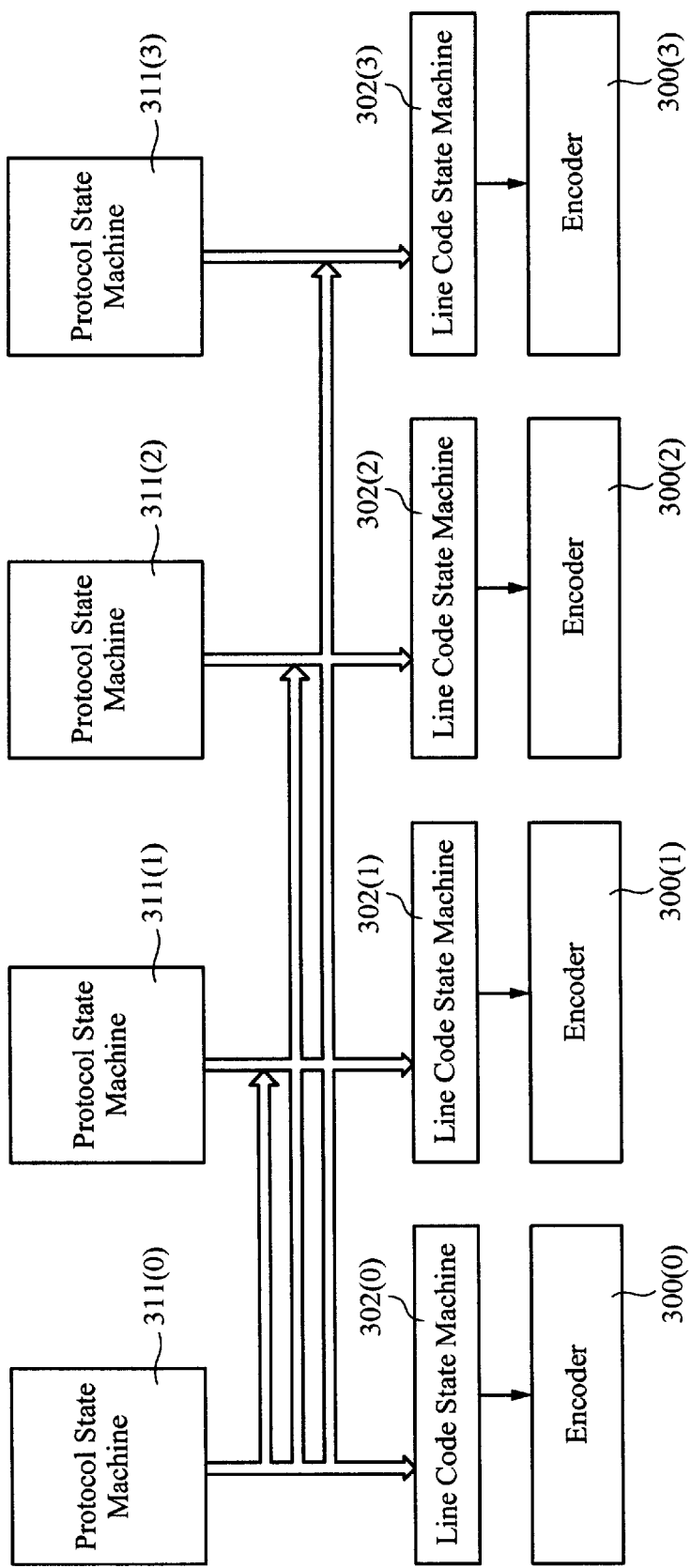
FIG. 4 is a simplified illustration of the NPCS system of FIG. 3.

A simplified illustration of the transmit portion of the PCS system is provided in FIG. 4. The transmit portion of the PCS system includes three circuit blocks for each channel; an encoder 300, a protocol state machine 311, and a code state machine 302. The encoder 300 acts as a pipeline for data, encoding according to standard IEEE 802.3z. The protocol state machine 311 wraps a protocol around the data to instruct the code state machine 302 to output the appropriate 10-bit data. The code state machine controls the pipeline to give the option of sending idles, data, special, or configuration code groups. When each channel (encoder) is operated independent, each protocol state machine 311 controls the code group state machine 302. When the system is operating in an extended channel, one protocol state machine 311 controls multiple code state machines 302(0) and 302(1), see FIG. 4. Multiple code state machines in extended mode are controlled by the lowest number channel ordered set state machine.

As an example, if a dual port PCS is selected to run in extended mode (one 20-bit wide channel), the ordered set state machine 311 for channel 0 controls both code group state machines 302 (0) and 302 (1) for channel 0 and channel 1. As such, the channel 1 ordered set state machine is inactive. If a dual port PCS is selected to run in two channels, each ordered set state machine controls the local code group state machine.

The present scalable 8B/10B encoder, described above, is a cornerstone of the NPCS design. With the scalable encoder, multiple encoders can be linked together automatically. The encoder has two outputs, one for a synchronous running disparity, and one for an asynchronous running disparity. An idle input is also provided which is used to transmit idle data from the encoder. The idle data can be selected based upon the running disparity. In one embodiment of the PCS system, either D5.6 or D16.2 is sent depending on the running disparity. As explained above, the slave input is used to prevent slave encoders from outputting special codes. For example, the slave input, when enabled, detects K28.5 patterns and sends a K28.x pattern that has been pre-selected.

In commercially available 8B/10B encoders, 8 bits of unrestricted data are input along with a control bit "K". The input data is provided on inputs A,B,C,D,E,F,G,H.

The input data is then mapped as 10-bit output data that is run length limited, and DC balanced. The ten bits of encoded output data are provided on outputs a,b,c,d,e,f,g,h,i,j.

The 8-bit to 10-bit encoding is implemented by dividing up the device into a 5-bit to 6-bit encoder, and a 3-bit to 4-bit encoder. An internal disparity device indicates if the running total of bits has more zeros, or more ones.

The coding formula used to encode 8-bits of data into 10-bits of data can be varied, and the present invention is not limited to any one formula. FIG. 6 illustrates one possible prior art mapping table for the 5b/6b encoders. Bits A,B,C, D,E are the five input bits that are to be encoded, with bit A being the least significant bit. The control bit K is logic low for every data byte that is transformed. If K is asserted high, the input is considered a special character, as explained below. The input data is illustrated as inputs A,B,C,D,E and each data has a corresponding name (data D.0–D.31, and control K.23, K.27–K.30). Referring to the "BIT ENC" column of FIG. 6, symbols starting with "L" represent bits A,B,C,D and bit E is represented by itself. The format is L<number of ones in ABCD><number of zeroes in ABCD>. For example, L04 refers to no ones and four zeros in ABCD. Note, the dot ("•") symbol indicates a logical and, while the tick "'" symbol indicates negation of the previous signal.

The mapping of the data from 5 bits (ABCDE) to 6 bits (abcdei) is accomplished by using the symbols in the "BIT ENC" column. The default mapping is to transfer the data ABCDE to abcde, and adding the bit 'i' as zero. For each Name entry, if there is a single symbol in the "BIT ENC"

column, the shaded bits in abcde are inverted from ABCDE, or if they are no shaded bits in abcd, the bit 'i' is set to one. If there are two symbols in the "BIT ENC" column, the shaded bits in ABCDE are inverted by the first symbol evaluated to true, and the 'i' bit is set to one given the second symbol evaluation to true. The disparity column defines the current disparity calculation. The current disparity is referred to as D0. If the current disparity (D0) does not match the previous disparity (D−1), the alternate columns are used to generate abcdei outputs. An 'X' is a don't care state, which also indicates there is no alternate output pattern.

FIG. 6 illustrates a prior art mapping table of one possible 3b/4b encoding formula. The 3B/4B operation is analogous to the 5B/6B table previously described.

Figure 7:
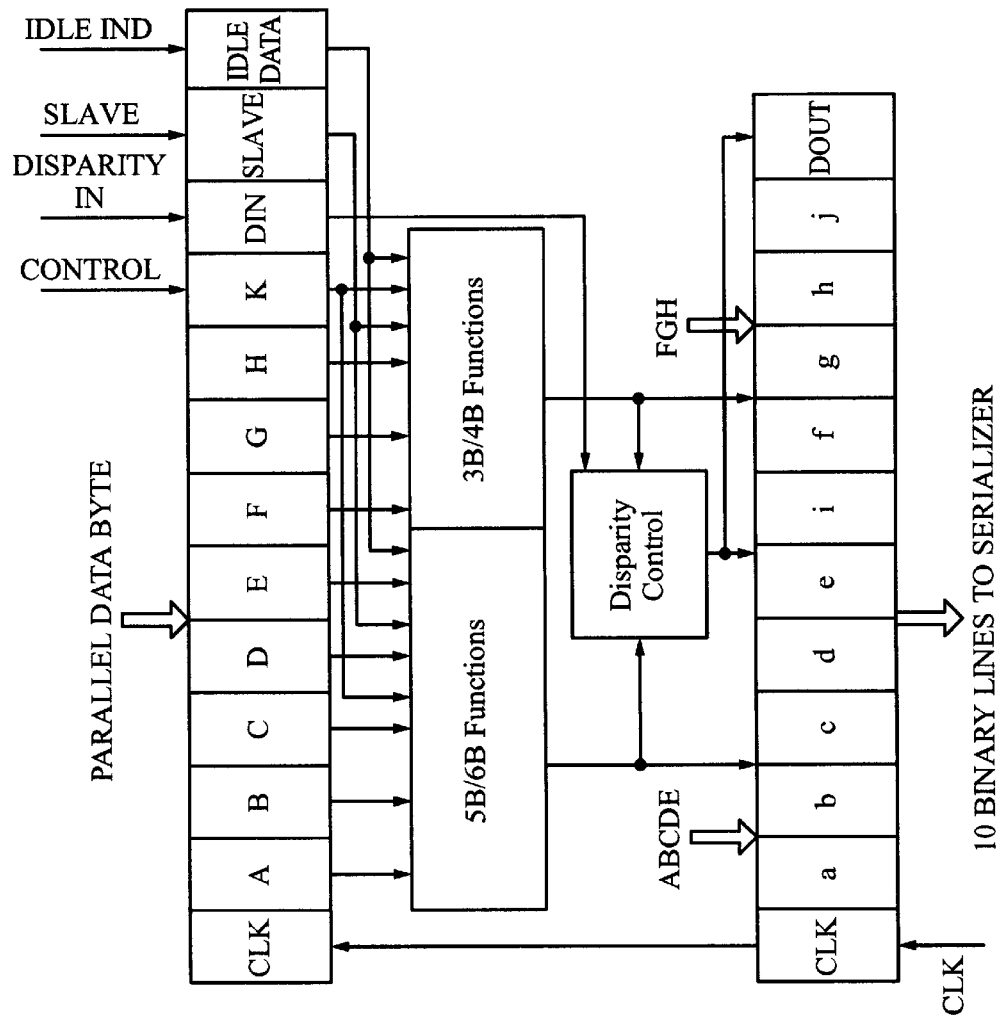
FIG. 7 is a more detailed block diagram of one embodiment of the encoder of FIG. 1.

FIG. 7 illustrates one embodiment of an 8B/10B encoder 300. Bits {A,B,C,D,E,F,G,H} are input with a control bit {K} and bits {a,b,c,d,e,i,f,g,h,j} are determined according to an 8B/10B encoding formula. The present invention allows both extended bandwidth operation, and also has the ability to create multiple domains of lesser bandwidth within an extended channel. For example, if a 6.25 Gbit channel is available, the present invention has the ability to operate as a single 6.25 Gbit channel, or as five 1.25 Gbit channels.

The encoder embodiment of FIG. 7 includes the input/output connections described in FIG. 1. The encoder has a 5B/6B encoder 303 and a 3B/4B encoder 305. These internal encoders are coupled to disparity control 301. The disparity control determines a current disparity of the ten output bits based on the encoders and the previous disparity provided on input 106.

FIG. 8 illustrates a table of some special codes that can be used as a physical coding sublayer application. The special codes are usually used for synchronization. For instance, in a Gigabit Ethernet application, a K28.5 pattern is used for alignment, and other codes are used for start of frame, end of frame, extension, and error indication. As stated above, the special codes are used when K=1. The slave input signal is used to substitute an inert special code for the special code. That is, multiple encoders should not transmit the same special code when the encoders are coupled to operate as a single encoder.

Referring to FIG. 9, a table is provided that illustrates some differences between the present invention and the 5B/6B encoding formula explained above. The slave function is represented in the table by an asterisk '*'. When the slave mode is asserted in one embodiment of the present invention, the encoder substitutes a standard encoded output in response to a K28.5 code with an output pattern defined by a user. Thus, the present invention allows pre-selected data to be substituted for specific input codes and output in a slave mode.

Referring to FIG. 10, a table is provided that illustrates some differences between the present invention and the 3B/4B encoding formula explained above. The slave function is represented in the table by an asterisk '*'. When the slave mode is asserted in one embodiment of the present invention, the encoder substitutes a response to the K28.5 code with a pattern defined by a user. Again, the present invention allows pre-selected data to be substituted for specific input codes and output in a slave mode.

An IDLE DATA function is also provided in one embodiment of the encoder. When the Idle signal is asserted (logical high), the encoder provides output data that insures a negative running disparity. For example, in one embodiment the encoder transmits an output code of D5.6 if the current disparity is negative. If the disparity is positive, the encoder transmits an output code of D16.2. It will be appreciated by those skilled in the art, that the above codes insure a negative running disparity during idle operation. These code selections are provided for Gigabit Ethernet applications, but can be changed. As such, the present invention allows the output data pattern to be selected based upon a current disparity condition.

An additional benefit of the present invention is auto negotiation of speed based on the slowest operating speed. For example, the present invention can negotiate speed based on the slowest speed of 1.25 Gbit. If the system is operating at 2.5 Gbit, the NPCS can be adjusted to operate at 2.5 Gbit.

CONCLUSION

A scalable physical coding sublayer (PCS) can be adjusted to provide different combinations of communication channels and data widths. The PCS can use 8B/10B encoders having a disparity input connection and at least one disparity output connection. In one embodiment, the encoder has both a synchronous and an asynchronous disparity output. The encoder can be coupled with additional encoders to provide an expanded width channel. The asynchronous disparity from a first encoder is coupled to the disparity input of a second encoder. The synchronous disparity output of the second encoder is coupled to the disparity input of the first encoder. Additional configurations have also been described. In expanded operation, only one of the encoders needs to output special codes. The encoders, therefore, include a slave input connection to place the encoder in a slave mode. The slave mode replaces a special output code with an inert special code. All but one encoder in an expanded system are slave encoders. An idle input connection is also provided in the encoders. The idle connection is used to place the encoder in an idle mode where pre-defined data is output from the encoder.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A scalable physical coding sublayer (PCS) system comprising:
    N encoders; and
    a controller to operate the N encoders to provide from 1 to N channels;
    wherein at least one of the N encoders comprises a slave input connection to receive a signal that instructs the at least one encoder to substitute a pre-defined control input data with a pre-defined output data.

2. The scalable PCS system of claim 1 further comprises a disparity select circuit coupled to the at least one encoder.

3. The scalable PCS system of claim 2 wherein the controller further operates the disparity select circuitry to provide an N-wide communication channel.

4. The scalable PCS system of claim 1 wherein each of the N encoders receives eight bits of input data, and the output is balanced and run length limited according to 8B/10B rules.

5. The scalable PCS system of claim 1 wherein the at least one encoder comprises:
    encoder circuitry to encode 8-bits of input data into 10-bits of output data; and
    disparity control circuitry to calculate a running disparity of the 10-bits of output data, the disparity control circuitry couples the running disparity to the synchronous and asynchronous data disparity outputs.

6. The scalable PCS system of claim 5 wherein the encoder circuitry comprises:

a 5B/6B encoder to encode 5-bits of input data into 6-bits of output data; and a 3B/4B encoder to encode 3-bits of input data into 4-bits of output data.

7. An encoder comprising:

encoder circuitry to encode N-bits of input data into M-bits of output data, M being a higher integer number than N;

disparity control circuitry to calculate a running disparity of the M-bits of output data, the disparity control circuitry coupling the running disparity to an external disparity connection of the encoder; and an idle signal input connection to receive an idle signal, wherein the encoder outputs idle data in response to the idle signal.

8. The encoder of claim 7 further comprises a disparity input connection to receive externally provided running disparity input signals.

9. The encoder of claim 7 wherein the running disparity output signal is synchronized with a clock signal.

10. An encoder comprising:

N input data connections to receive N input data signals;

a control input connection to receive a control signal;

a disparity input connection to receive a disparity input signal;

M output data connections to provide M encoded output data signals, M being a higher integer number than N;

a disparity output connection indicating a running disparity based on the M encoded output data signals and the disparity input signal; and a slave input connection to receive a slave signal that instructs the encoder to substitute pre-defined control input data with pre-defined output data.

11. The encoder of claim 10 further comprising:

an idle input connection to receive an idle input signal that instructs the encoder to provide defined idle data on the ten output data connections.

* * * * *